United States Patent
Heier et al.

(10) Patent No.: US 9,852,606 B1
(45) Date of Patent: Dec. 26, 2017

(54) SYSTEM AND METHOD FOR CRIME INVESTIGATION

(71) Applicant: Verint Americas Inc., Alpharetta, GA (US)

(72) Inventors: Kurt Heier, Highlands Ranch, CO (US); Derek Shoaf, Arvada, CO (US)

(73) Assignee: VERINT AMERICAS INC, Alpharetta, GA (US)

( * ) Notice: Subject to any disclaimer, the term of this patent is extended or adjusted under 35 U.S.C. 154(b) by 0 days.

(21) Appl. No.: 15/483,248

(22) Filed: Apr. 10, 2017

(51) Int. Cl.
- G08B 9/00 (2006.01)
- G08B 25/00 (2006.01)
- G08B 13/196 (2006.01)
- G06F 17/30 (2006.01)
- G06F 17/15 (2006.01)

(52) U.S. Cl.
CPC ........... *G08B 25/004* (2013.01); *G06F 17/15* (2013.01); *G06F 17/30035* (2013.01); *G06F 17/30064* (2013.01); *G08B 13/19645* (2013.01)

(58) Field of Classification Search
CPC combination set(s) only.
See application file for complete search history.

(56) References Cited

U.S. PATENT DOCUMENTS

| | | | |
|---|---|---|---|
| 8,587,662 B1 * | 11/2013 | Moll | G08B 31/00 348/143 |
| 9,329,597 B2 * | 5/2016 | Stoschek | G05D 1/021 |
| 2014/0254890 A1 * | 9/2014 | Bergman | G08B 13/248 382/118 |
| 2015/0205298 A1 * | 7/2015 | Stoschek | G05D 1/021 701/23 |
| 2016/0196485 A1 * | 7/2016 | Patterson | G06K 19/0723 340/572.1 |
| 2017/0136631 A1 * | 5/2017 | Li | B25J 19/005 |

\* cited by examiner

*Primary Examiner* — Travis Hunnings
(74) *Attorney, Agent, or Firm* — Meunier Carlin & Curfman

(57) ABSTRACT

A system and method for investigating crimes occurring at locations that are communicatively connected by a central server is disclosed. The investigation is highly automated and obtains evidence using computer aided searches of historic surveillance data gathered at locations within a computer search area. The investigation also utilizes active searches of real-time surveillance data gathered at the locations in response to a be-on-the-look-out (BOLO) alert sent to the locations from the central server. Based on evidence obtained from these searches, the search area may be updated and the searches may be repeated to follow a moving crime pattern/route. In addition, the information provided from the searches may facilitate the prediction of a location that is likely to experience a crime in the future. Accordingly, the central server may transmit a high alert to the predicted location.

20 Claims, 3 Drawing Sheets

SYSTEM AND METHOD FOR CRIME INVESTIGATION

FIELD OF THE INVENTION

The present disclosure relates to crime investigation. More specifically, the present disclosure relates to a system and method for reporting, investigating, and predicting crimes by analyzing surveillance data from different locations and generating targeted alerts.

BACKGROUND

Organized crime is a problem in retail stores. Organized retail crime (ORC) is characterized by gangs of criminals that work together to steal items from retail stores. ORC gangs include thieves (i.e., "boosters") that shoplift or steal cargo for the gang. The thieves may move from store-to-store and may rob several stores in a day. Sometimes the thieves repeatedly rob the same store over time. ORC gangs may be wide ranging and may move from location-to-location, thereby improving the odds of avoiding capture.

After stealing the items, the thieves may convert the stolen items into value (e.g., money, drugs, etc.) in a variety of ways. Thieves may sell the stolen items to street-level fences who resell the items at discount stores, flea markets or through online auctions. The rise of social media provides easy access to potential buyers, so in some cases, thieves can sell items directly to customers as a result of an announcement (i.e., post) on social media. This social media aspect has eased the transaction component of the crime, expediting the completion of the crime-to-value process. For example, a thief may steal an item from a retail store and then post the item for sale immediately after leaving the store. If the thief immediately finds a buyer, the entire crime may transact within an hour. Thus, these crimes are increasingly attractive to criminals.

ORC thieves are typically repeat offenders and often commit their crimes according to some pattern. For example, thieves may target a store (or chain of stores) because it is an easy target due to lax security, a crowded environment, and/or an easy escape route (e.g., close to a highway). In addition, these thieves may operate during a particular time to aid their success (e.g., at a shift change, close to closing, etc.). Determining these patterns could help investigators catch these thieves and/or recover stolen property by preemptively detecting crimes and preparing accordingly.

Retail stores address crime investigation and asset protection/recovery in a variety of ways. One way utilizes a network of video cameras to monitor areas in or around a retail store location. The video captured by these systems include all activity—good and bad. As a result, investigating a crime may be difficult because of the quantity of video available to search. The severity of this problem compounds when investigators attempt to identify repeat offenders and/or correlate the surveillance data gathered at different stores to determine a repeat offender's pattern (i.e., modus operandi). For example, a single ORC investigation would require investigators to search hundreds of hours of video captured by multiple cameras at multiple store locations. Because a store may experience many crimes and because acting quickly is an important element in solving crimes and/or recovering stolen items, a traditional approach to investigation is impractical if not impossible. A need, therefore, exists for systems and methods to improve ORC investigations and preemptively detect likely crimes.

In particular, some ORC investigation improvements that are needed include (i) enabling users to easily share evidence collected at different times and locations, (ii) aggregating the shared evidence, (iii) projecting future criminal activity based on the aggregated evidence, and (iv) adjusting the search for a suspect or stolen item based on the projected future criminal activity.

SUMMARY

Accordingly, in one aspect, the present disclosure embraces a method for computer-enabled crime investigation. The method includes providing a central server that is in communication with a network of client computers. For example, in a possible embodiment, each client computer is located at one store location of a chain of stores. A crime report is received at the central server from one of the client computers and a record of the crime is created in a record database. The crime report includes details of a crime, a location of the crime, and identifying information of a suspect of the crime. Based on the location of the crime, a search area is computed and two types of searches are performed.

The first type of search performed is a historic search for the suspect. The historic search includes searching for the suspect in surveillance data collected at store locations within the search area. Then, based on the search, times/locations that the suspect was observed as well as other identifying information of the suspect are determined and the record is updated to include this information.

The second type of search performed is an active search for the suspect. The active search includes creating a be-on-the-look-out (BOLO) alert with the suspect's identifying information obtained from the record. The BOLO alert is transmitted to all client computers within the search area. The client computers in the search area are then monitored for responses to the BOLO alert (i.e., BOLO responses), which include recent locations that the suspect was observed. If a response is received then the search area (and record) can be updated.

The historic search and the active search are repeated to gather additional evidence from (and to issue BOLO alerts to) stores in the updated search area. The process repeats until the BOLO alert is closed or until the historic search and the active search return no results for a period.

In an exemplary embodiment of the method, the surveillance data is surveillance video, and searching for the suspect within the surveillance video includes applying facial recognition or license plate recognition to the surveillance video.

In another exemplary embodiment of the method, the repeated historic and active searches serve as a basis for determining a store location that the suspect is likely to visit in the future. Accordingly, a high alert can be transmitted to the client computer located at the store location determined likely to be visited by the suspect. The determination of the store location can, in some embodiments, include creating a map of store locations at which the suspect was observed. From the map, a suspect range may be computed, and based on the suspect range, a store location that the suspect is likely to visit in the future may be determined.

In another exemplary embodiment, a high alert may be transmitted to a client computer at a store location that is likely to experience a crime in the future. In some embodiments, the determination of the likely store location includes creating a map of store locations that the suspect has acted criminally to compute a projected crime route. Then, from the projected crime route, determining a store location that is likely to experience a future crime. In some cases, computing the projected crime area includes correlating the store locations that the suspect has acted criminally with high-crime areas or with highways.

In another exemplary embodiment, the identifying information of a subject included in the crime report (or BOLO response) may include a description of the suspect, a description of the suspect's clothing, an image of the suspect, a description of the suspect's vehicle, an image of the suspect's vehicle, and/or a license plate number of the suspect's vehicle.

In another exemplary embodiment, the details of a crime included in the crime report (or BOLO response) may include a type of crime, a description of the crime, a video of the crime, a description of a stolen item, and/or an image of the stolen item.

In possible embodiments, the method for computer-enabled crime investigation may include other searches in addition to the historic search and the active search. For example, a web search may be performed for a stolen item. A web search may include searching social media for a description/image of the stolen item in a post that originates from within the search area. From this search, the suspect's (social media) identity and location (at the time of the post) may be obtained. Accordingly, the record (or search area) may be updated to include this evidence. Further, it is possible to generate and transmit a web alert that includes this evidence to client computers within the search area.

In another aspect, the present disclosure embraces a system for computer-enabled crime investigation. The system includes a network of client computers that are located at stores of a chain of stores. The system also includes a record database that stores records of crimes committed at the stores. Each record in the record database includes information about a crime that can be used as evidence for investigation. For example, a record may include details of a crime, a location of the crime, and/or identifying information of a suspect of the crime. A central server is in communication with the record database and the network of client computers. The central server has a processor that is configured by software instructions to execute various embodiments of the method for computer-enabled crime investigation described above.

In an exemplary embodiment, each store includes a video surveillance system that is communicatively couple to the store's client computer. Accordingly, searching for the suspect in surveillance data collected at store locations within the search area my include applying facial recognition or license plate recognition to the surveillance video.

In another exemplary embodiment, the system may include mobile computing devices or point of sale devices (e.g., cash registers) that are communicatively coupled to client computers to receive high alerts from the client computers. For example, an image of the suspect may be transmitted (i.e., "pushed") to a mobile device at a store location that is under high alert.

In another aspect, the present disclosure embraces a non-transitory tangible computer readable medium containing computer readable instructions that when executed by a processor of a computer cause the computer to execute the various embodiments of the method for computer-enabled crime investigation described above.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

Figure (FIG.) 1 schematically depicts a system for computer enabled crime investigation according to an embodiment of the present disclosure.

DETAILED DESCRIPTION

Figure 1:
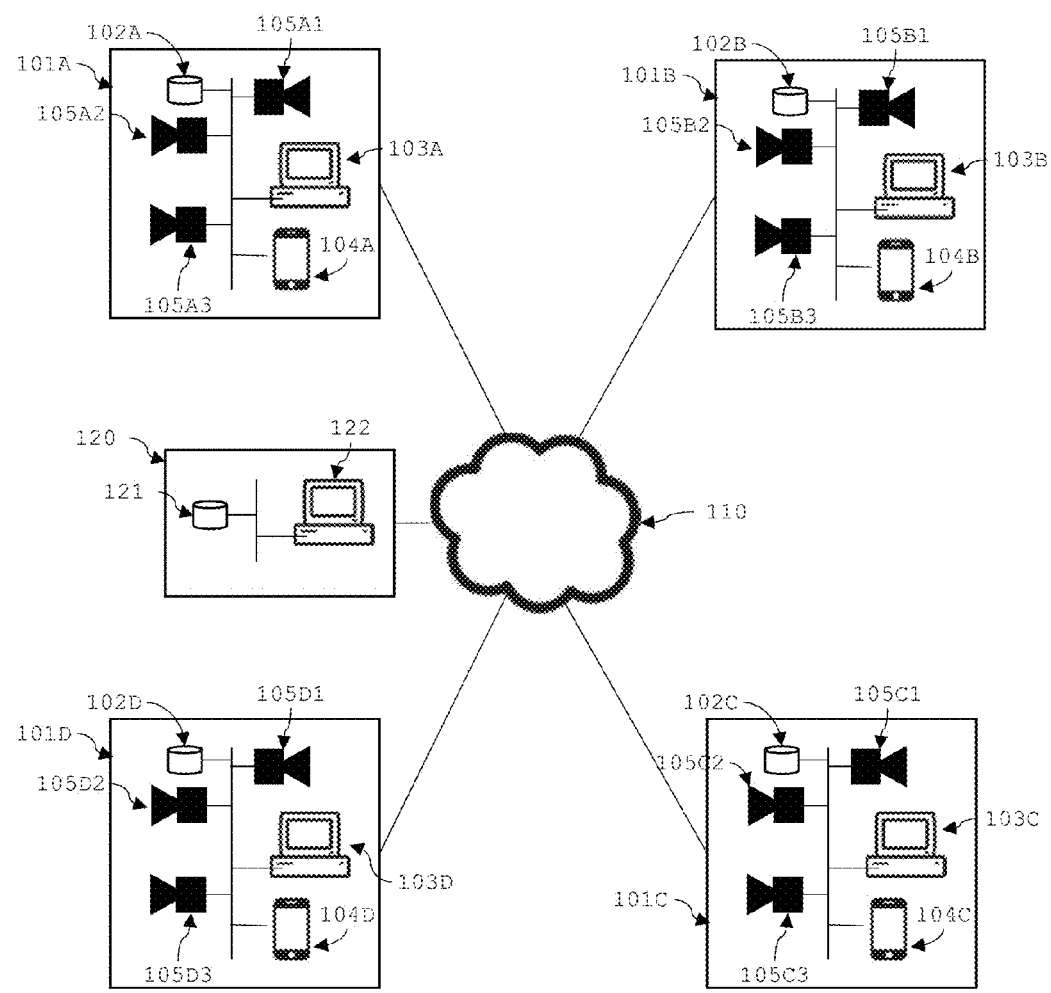

An exemplary system for computer enabled crime investigation is shown schematically in FIG. 1. The system includes a plurality of locations 101A-D that are spaced apart and that may experience a crime.

For the purposes of this disclosure, the locations 101A-D will be described as retail store locations, wherein the stores are part of a chain of stores. This is not intended to be limiting to the scope of the present disclosure because the present disclosure may apply to other locations and/or other environments. For example, the locations may be locations within a city (e.g., subway stations, parks, intersections, etc.). In another example, the locations may be areas that are spaced apart but that are within the same facility (e.g., a mall, an airport, etc.).

In addition, for the purposes of this disclosure, theft is considered as the crime under investigation. This is not intended to be limiting to the scope of the present disclosure because the present disclosure may be applied to investigate other crimes. For example, retail stores may experience a wide range of crime types or fraud types, including (but not limited to) check fraud, counterfeiting, barcode alteration, and/or inside collusion (i.e., "sweet hearting"). Further, other locations may experience crimes that do not relate to transactions. For example, a subway station may experience a wide range of crime types or fraud types, including (but not limited to) violent crimes, pick-pocketing, begging, and/or vandalism. In another example, city law enforcement may use the systems and methods disclosed to search for wanted criminals, missing persons, terrorist, and/or missing children (e.g., Amber alert).

The store locations typically have at least one client computer 103A-D. Each client computer 103A-D may communicate to a video surveillance system that includes one or more video cameras 105A1-A3, 105B1-B3, 105C1-C3, 105D1-D3 that capture video of one or more areas in or around each store (e.g., entrances, exits, aisles, cash registers, parking lots, loading docks, etc.). The cameras at each store may record the captured video in a video database 102A-D located at each store location.

The client computers 103A-D may be part of a video management system (VMS) that interacts with the local network of video cameras 105A1-A3, 105B1-B3, 105C1-C3, 105D1-D3 and the video database 102A-D. For example, a user at a client computer 103A-D may use the VMS to control the operation (e.g., on/off, pan/tilt/zoom, etc.) of one or more cameras in the store's camera network. In addition, a user (or automated script) may use the VMS to search and review video stored in the video database 102A-D. In some cases, the VMS and/or the client computer may utilize algorithms to process the video to obtain additional information. For example, recognition algorithms may be used to recognize faces or features (e.g., clothing, hair color, etc.) in recorded video from one or more example (i.e., training) images. In another example, recognition algorithms may be used to read vehicle license plates. In another example, recognition algorithms may be used to identify particular behaviors (e.g., movement).

The store locations 101A-D may also have one or more mobile devices 104A-D in communication with the client computers 103A-D. Accordingly, the communication network connecting these items may be wireless. A mobile device may be embodied in various ways, including (but not limited to) a smart phone, a tablet, or a laptop. The mobile device is typically used by a store employee (e.g., manager) to interact with the client computer. For example, a mobile device 104A may receive alerts from the client computer 103A. Alternatively, the mobile device 104A may transmit alerts or alert responses to the client computer 103A. The alerts or alert responses may include text and media (e.g., image or video).

The store locations 101A-D may also have one or more point-of-sale devices (not shown) in communication with the client computers 103A-D. The point-of-sale devices may be embodied in a variety of ways, such as a cash register. In some embodiments, the point-of-sale devices may receive alerts from the client computer at a store location and display them to a user (e.g., picture of wanted criminal). In addition, the point-of-sale devices may be configured allow a user to transmit a response to the alerts (e.g., wanted criminal observed).

The store locations 101A-D are typically geographically separated and may communicate via a network (e.g., the internet) 110. In a possible embodiment, a client computer 103A at a first store may communicate with one or more client computers 103B-D located at other stores. In addition, the client computers 103A-D may communicate with a central server 122 that is typically located in a location 120 that remote to all the store locations 101A-D.

The central server 122 may receive information from all store locations 101A-D. For example, a crime report may be created using a client computer 103A-D or a mobile device 104A-D at a store location 101A-D. The crime report includes details of a crime that was witnessed or otherwise experienced in or around a store location.

The details of the crime may include a description of the crime. For example, the type of crime may be included (e.g., shoplifting, armed robbery, cargo theft, etc.). The details of the crime may also include a description of an item stolen (e.g., brand, model, barcode information, serial number, etc.). The details of the crime may also include an image of the stolen item or an image of an item like the stolen item. The details of the crime may also include a video of the crime captured by a store's network of cameras.

The crime report may also include a time and a location of the crime. For example, a store number and/or address may be included in the crime report and may be used to plot the store location on a map. In some cases, the store's internet protocol (IP) address may be used to automatically determine the location of the crime. In some cases, an area within the store at which the crime took place may be included in the crime report. For crimes involving truck cargo, a truck identification, a package identification (e.g., pallet number, tracking ID, etc.), or a loading dock identification may be included in the crime report.

The crime report may also include identifying information of one or more suspects of the crime. The identifying information may include a description of the suspect, a description of the suspect's clothing, and/or image or video of the suspect. In addition, the identifying information may include information regarding the suspect's vehicle. The vehicle information may include a description of the vehicle (e.g., type, make, model, color, etc.) and/or a description of the license plate (e.g., state, partial number, etc.) or an image or video of the license plate.

Evidence of a crime in the form of video and/or images may be obtained manually from the video database 102A-D of the store location that experienced the crime (i.e., the victim store) for inclusion with the crime report. For example, a user may witness a crime or the effects of a crime and then use the VMS to search video data for evidence to include with the crime report. Alternatively, video and/or images corresponding to a crime may be obtained automatically for inclusion with the crime report. For example, a VMS may be configured to recognize crimes or suspicious activities within captured video based on alarm settings (e.g., activity in a secure area after business hours) in the VMS. If a crime is recognized, a crime report may be generated automatically by the VMS. A user may verify the crime before transmitting the crime report to the central server. Further, in another possible embodiment, a mobile device may be used to capture video of a crime as it happens for inclusion with a crime report.

Figure 2:
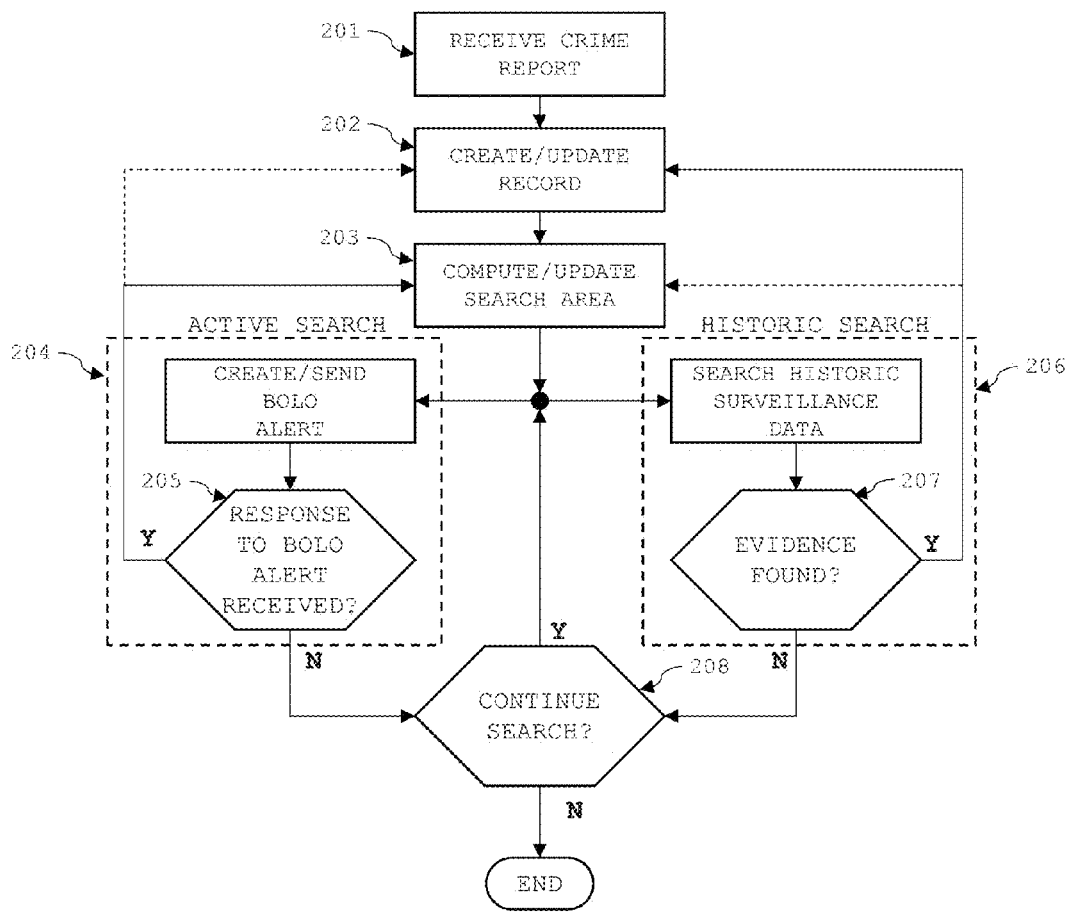
FIG. 2 is a flow chart of a method for computer enabled crime investigation according to an embodiment of the present disclosure.

The central server 122 includes one or more processors and memory. Software stored in the central server's memory may configure the central server to perform a computer-enabled method to investigate a crime. A flowchart for an exemplary embodiment of the method is shown in FIG. 2.

In response to a crime at a store location, a crime report is created at the victim store location and transmitted to the central server 122. The central server receives 201 the crime report and creates 202 a record of the crime in a record database.

Based on the location of the crime indicated in the record, the central server computes 203 an initial search area. The initial search area typically includes stores proximate to the victim store (e.g., within a five mile radius); however, other criteria may be used for computing an initial search area. For example, in addition to a geographic radius, the initial search area may be adapted to include repeatedly victimized stores (e.g., stores with many crime records) or busy stores. After the initial search area is created, various searches for evidence material to the crime are automatically launched.

A historic search 206 is executed to search stored surveillance data at each store location (i.e., store) in the initial search area. For example, a facial image of the suspect included in the crime record (i.e., record) may be used to search the video database 102A-D at each store in the search area. In this case, facial recognition algorithms running either on each client computer or on the central server attempt to find matches in the stored video. Possible matches may be collected and presented to a user for verification. If a match (i.e., evidence) is found 207, then the record is updated 202 to include the new evidence. For example, additional facial images of the suspect may be added to the record, thereby improving subsequent facial recognition searches. In another example, the times and locations that the suspect has been observed historically may help to constrain subsequent searches of the video. In still another example, if the suspect has been repeatedly observed shopping at another store, then it is likely that the suspect will appear at that store again (and may live nearby). Accordingly, in a possible embodiment the search area can be updated 203 to include this store.

In addition to the historic search, an active search 204 is executed to search for the suspect in real time. The active search may be completely automated or may utilize human input. A be-on-the-look-out (BOLO) alert is created by the central server using the information from the record and transmitted to all stores within the initial search area. In a completely automated embodiment, the BOLO alert may create an alarm setting in the VMS. For example, the video surveillance system at each store in the initial search area may be configured to search all faces entering the store for the suspect. The search of faces typically includes a facial recognition algorithm that operates locally (e.g., at the store location) or remotely (e.g., at the central server) to analyze the video. If a match is found, a BOLO response may be created and transmitted to alert others that the suspect has been detected. The BOLO response (i.e., suspect alert) may be received 205 at the central server with the matching image of the suspect and the time/location. In some cases, a human may verify the match before the BOLO response is transmitted or before further action is taken based on the BOLO response.

A user may also generate a BOLO response to alert others that the suspect has been spotted (i.e., suspect alert). For example, a user may receive (e.g., on the client computer, the mobile device, or point-of-sale device) a BOLO alert (including an image of the suspect). Later, the user may recognize the suspect, create a BOLO response, and send the BOLO response to the central server. The BOLO response need not include an image to be helpful. For example, just an observation of the suspect at a particular time and location provides the search with additional evidence with which the search may be adapted.

The response to the BOLO alert may be used to update the initial search area. For example, if an initial search area is an area centered at a first store, a BOLO response from a second store may update 203 the search area to center it around the second store. The adaptation of the search area helps to catch gangs of criminals that move along a route from store-to-store. In addition, if the response to the BOLO alert includes additional evidence, such as a facial image, the record may be updated as well 202.

The historic and active searches continue to adapt search areas and perform repeated historic searches and active searches to expand the criminal record stored in the record database over time. This iterative evidence collection may continue 208 indefinitely until the suspect is captured and the record is closed. Alternatively, the search may be ended when the case goes cold. For example, a cold case is one in which neither the active search nor the historic search return any evidence for a predetermined number of iterations or for a predetermined period.

In addition to the historic and active searches for a suspect, it is also possible to search for a stolen item. In one embodiment, a web search may be performed in search of the stolen item. A web search may include searching social media for characteristics of the item. The characteristics may include a description of the item (e.g., brand, model, color, operating characteristics, etc.), an identifier of the item (e.g., a serial number), or an image of the item itself or a representative surrogate. The search may be refined to an area. For example, only social media posts originating from an area around the store may be searched for the item's characteristics. If the stolen item is found, then the seller's location and social media identity may be used to expand the evidence in the record. The seller may not necessarily be the suspect but it is likely that the seller has a business or personal relationship with the suspect or at least some knowledge of the suspect. In addition, the seller's location at the time of the post may be used to adjust the search area. A web alert may be transmitted to computers in the search area. The web alert may include the description of the stolen item and the location and social media identity of the suspect or suspect's agent.

The adaptability of the search and the expansion of the record may provide a predictive aspect to the crime investigation. For example, if either the crimes of a suspect or the appearance of the suspect historically and/or actively suggest a pattern/trend, then a high alert may be issued to stores that the pattern/trend suggest will receive a visit or a crime in the future. For example, by extrapolating the geographic activity of the suspect, certain stores may be placed on high alert. A high alert may trigger the employees or systems to take extra precaution (e.g., add security personnel) and/or gather additional and/or higher quality surveillance data.

Figure 3:
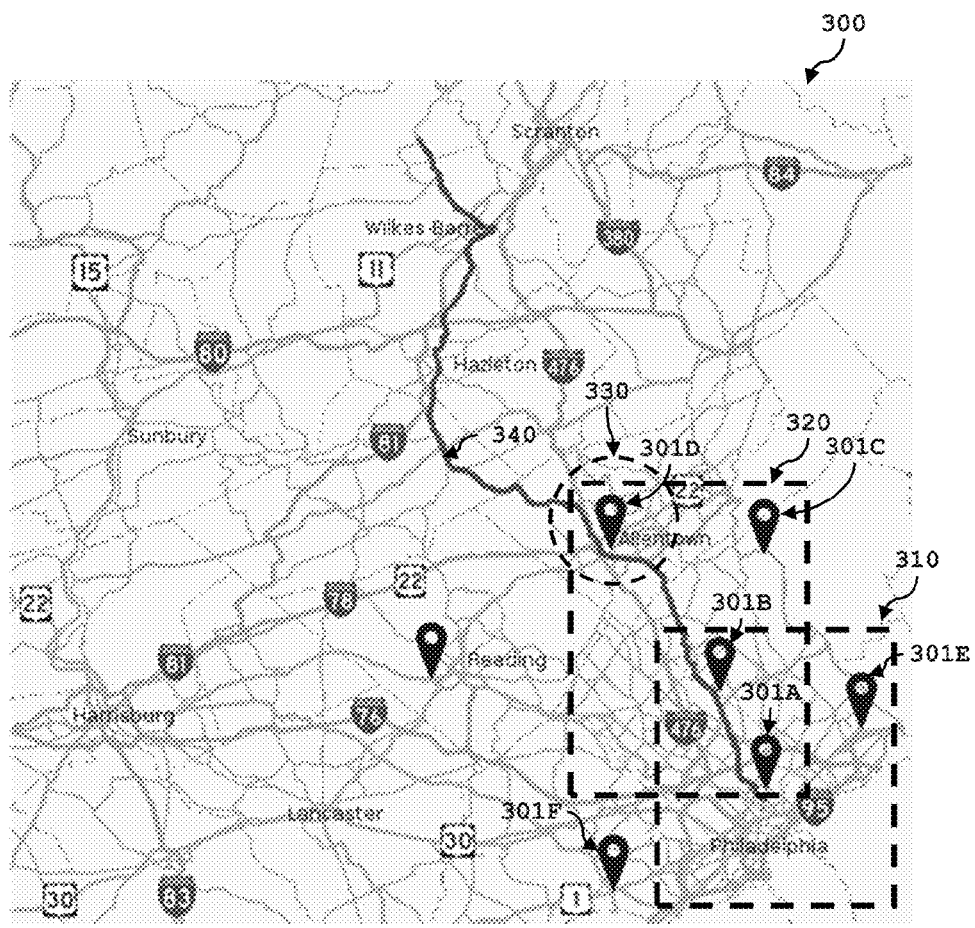
FIG. 3 graphically depicts an implementation of a crime investigation according to an embodiment of the present disclosure.

An exemplary implementation of the computer-enabled crime investigation including selecting a store for high alert is shown in FIG. 3. The search begins with receiving a crime report from a first store 301A. An initial search area 310 is computed and the stores 301A, 301B, and 301E within the initial search area are searched using at least the historic and active searches described above. It should be noted, while the search area in FIG. 3 is shown as rectangular, in general search areas may be any shape and are typically sized to include more than one store. BOLO alerts are sent to stores in the initial search area 310 and the central server monitors the stores for a response. Later, the suspect is observed at a second store 301B and a BOLO response from this store is received at the central server. Based on the location of the second store 301B, the search area may be updated to form an updated search area 320. The updated search area 320 includes the victim store 301A, the second store 301B, and two other stores 301C, 301D not included in the initial search area. At this point, the record contains evidence showing that the suspect committed a crime at a first store 301A and then committed a second crime (or was simply observed) later at a second store 301B. Using this information, a suspect range and/or a crime route may be created using the information in the record. A suspect range corresponds to the area that the suspect roams within and is based on observations of the suspect. A crime route corresponds to a route traversed by the suspect over some period and is based on crimes committed by the suspect. The crime route may be projected (i.e., extrapolated) based on the locations of the crimes committed by the subject, and in some cases may be based on additional information that corresponds to the likelihood of a crime.

Using the suspect range and/or projected crime route a store that is at high risk of either observing the suspect or experiencing a crime may be determined. For example, as shown in FIG. 3, the first store 301A and second store 301B form a crime route. At this point, it is unknown if it is more likely that the crime route is generally heading north to third store 301C or north-west to fourth store 301D. Additional information may be used to determine the store that is more likely to be on the crime route. For example, it is generally known that stores along highways or in high crime areas are more likely to experience crime. Using this knowledge, it is determined that the fourth store 301D is the most likely next store to experience a crime (or visit) by the suspect. As a result, fourth store 301D is selected 330 to receive a high alert. Accordingly, the central server transmits a high alert to the fourth store 301D. Additionally, a projected crime route 340 may be computed and displayed on the map 300.

The likelihood of a location experiencing a crime or observing a suspect may be determined using a variety of methods. For example, a score may be assigned to store locations based on the crime route, suspect range, and/or the attractiveness of a store for crime (e.g., store crime-rate, ease of escape, neighborhood crime-rate, etc.). A "likely" store location may be a store location with a score that is higher than scores of other store locations. Alternatively, a "likely" store location may be a store location with a score above a threshold value.

As shown in the exemplary implementation in FIG. 3, stores may receive BOLO alerts and/or high alerts depending on the evolution of a repeating search. One store in the first search area 301E receives an alert but then the search area moves and the store is no longer included. In general, if a search area moves past a store, then the store may or may not receive an announcement that the BOLO alert has expired. In some cases, a store appears in a first search area 310 and also in the second (i.e., updated) search area 320. In this case, the store may or may not receive additional BOLO alerts based on the updated search area. In some embodiments, the BOLO alerts may display the search area and the stores within the search area on a map 300 as in FIG. 3. In this case, the movement of the search area may be obvious to a user. In other embodiments, the central server may make a searchable map that illustrates all active searches available to all stores. In this way, a user at a fifth store 301F that is never in a search area may still access the central server to monitor the progress of a search.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A method for computer-enabled crime investigation, the method comprising:
   providing a central server that is in communication with a network of client computers, wherein each client computer is located at one store location of a chain of stores;
   receiving a crime report from one of the client computers, the crime report comprising details of a crime, a location of the crime, and identifying information of a suspect of the crime;
   creating a record of the crime in a record database;
   computing a search area based on the location of the crime;
   performing a historic search for the suspect, wherein the historic search comprises:
      searching for the suspect in surveillance data collected at store locations within the search area;
      determining, based on the search, (i) times and locations that the suspect was observed and (ii) other identifying information of the suspect, and
      updating the record to include (i) the times and locations and (ii) the other identifying information;
   performing an active search for the suspect, wherein the active search comprises:
      creating a be-on-the-look-out (BOLO) alert comprising the identifying information of the suspect obtained from the record,
      transmitting the BOLO alert to all client computers within the search area,
      monitoring the client computers in the search area for responses to the BOLO alert, wherein the responses to the BOLO alert include recent locations that the suspect was observed, and
      updating the search area based on the responses to the BOLO alert; and
   repeating the historic search and the active search until the BOLO alert is closed or until the historic search and the active search return no results for a period.

2. The method according to claim 1, wherein:
   the surveillance data comprises surveillance video, and wherein:
   the searching for the suspect in surveillance data collected at store locations within the search area, comprises applying facial recognition or license plate recognition to the surveillance video.

3. The method according to claim 1, further comprising:
   determining a store location that the suspect is likely to visit in the future based on the historic search and active search results; and
   transmitting a high alert to the client computer at the determined store location.

4. The method according to claim 3, wherein the determining a store location comprises:
   creating a map of store locations that the suspect has been observed;
   computing a suspect range from the map; and
   determining, from the suspect range, a store location that the suspect is likely to visit in the future.

5. The method according to claim 1, further comprising:
   determining a store location that is likely to experience a crime in the future based on the historic search and active search results; and
   transmitting a high alert to the determined store location.

6. The method according to claim 5, the determining a store location comprises:
   creating a map of store locations that the suspect has acted criminally;
   computing a projected crime route from the map; and
   determining, from the projected crime route, a store location that is likely to experience a crime in the future.

7. The method according to claim 6, wherein the computing a projected crime route comprises correlating the store locations that the suspect has acted criminally with high-crime areas or with highways.

8. The method according to claim 1, wherein the identifying information of a subject comprises one or more of a group comprising:
   a description of the suspect, a description of the suspect's clothing, an image of the suspect, a description of a suspect's vehicle, an image of a suspect's vehicle, and a license plate number of a suspect's vehicle.

9. The method according to claim 1, wherein the details of a crime comprises one or more of a group comprising:
   a type of crime, a description of crime, a video of the crime, a description of a stolen item, and an image of a stolen item.

10. The method according to claim 9, further comprising:
    performing a web search for a stolen item, wherein the web search comprises:
       searching social media for a description/image of the stolen item in a post that originates from within the search area,
       determining, from the search, a social media identity of the suspect and a location of the suspect at the time of the post, and updating the record to include the social media identity of the suspect and the location of the suspect at the time of the post.

11. The method according to claim 10, wherein the performing a web search for a stolen item further comprises:
generating a web alert comprising the location of the suspect at the time of the post, and
transmitting the web alert to client computers within the search area.

12. A system for computer-enabled crime investigation, the system comprising:
a network of client computers that are located at stores of a chain of stores;
a record database storing records of crimes committed at the stores, wherein each record of a crime comprises details of the crime, a location of the crime, and identifying information of a suspect of the crime; and
a central server that is in communication with the record database and the network of client computers, wherein a processor of the central server is configured by software instructions to:
receive a crime report from one of the client computers, the crime report;
create a record of the crime in the record database;
compute a search area based on the location of the crime;
perform a historic search for the suspect, wherein the historic search comprises:
searching for the suspect in surveillance data collected at the stores within the search area;
determining, based on the search, (i) times and locations that the suspect was observed and (ii) other identifying information of the suspect, and
updating the record to include (i) the times and locations and (ii) the other identifying information;
performing an active search for the suspect, wherein the active search comprises:
creating a be-on-the-look-out (BOLO) alert comprising the identifying information of the suspect obtained from the record,
transmitting the BOLO alert to all client computers within the search area,
monitoring the client computers in the search area for a responses to the BOLO alert, wherein the responses to the BOLO alert include recent locations that the suspect was observed, and
updating the search area based on the responses to the BOLO alert; and
repeat the historic search and the active search until the BOLO alert is closed or until the historic search and the active search return no results for a period.

13. The system according to claim 12, further comprising video surveillance systems communicatively coupled to each of the client computers.

14. The system according to claim 13, wherein the searching for the suspect in surveillance data collected at store locations within the search area comprises applying facial recognition or license plate recognition to surveillance video captured by the video surveillance systems.

15. The system according to claim 12, wherein the processor of the central server is further configured by software instructions to:
determine a store location that is likely to experience a crime in the future based on the historic search and active search results; and
transmit a high alert to the determined store location.

16. The system according to claim 15, wherein to determine a store location that is likely to experience a crime in the future, the processor of the central server is further configured by software instructions to:
create a map of store locations that the suspect has acted criminally;
compute a projected crime route from the map; and
determine, from the projected crime route, a store location that is likely to experience a crime in the future.

17. The system according to claim 16, wherein the computing a projected crime route comprises correlating the store locations that the suspect has acted criminally with high-crime areas or highways.

18. The system according to claim 15, further comprising mobile computing devices or point of sale devices that are communicatively coupled to the client computer and receive the high alert from the client computer.

19. The system according to claim 18, wherein the high alert includes one or more images of the suspect.

20. A non-transitory computer readable medium having stored thereon instructions for computer-enabled crime investigation, that when executed by a central server that is in communication with a record database and a network of client computers at store locations, direct the central server to:
receive a crime report from one of the client computers, the crime report comprising details of a crime, a location of the crime, and identifying information of a suspect of the crime;
create a record of the crime in the record database;
compute a search area based on the location of the crime;
perform a historic search for the suspect, wherein the historic search comprises:
searching for the suspect in surveillance data collected at store locations within the search area;
determining, based on the search, (i) times and locations that the suspect was observed and (ii) other identifying information of the suspect, and
updating the record to include (i) the times and locations and (ii) the other identifying information;
perform an active search for the suspect, wherein the active search comprises:
creating a be-on-the-look-out (BOLO) alert comprising the identifying information of the suspect obtained from the record,
transmitting the BOLO alert to all client computers within the search area,
monitoring the client computers in the search area for a responses to the BOLO alert, wherein the responses to the BOLO alert include recent locations that the suspect was observed, and
updating the search area based on the responses to the BOLO alert; and
repeating the historic search and the active search until the BOLO alert is closed or until the historic search and the active searches return no results for a period.

* * * * *